(12) United States Patent
Tsukamoto et al.

(10) Patent No.: US 7,701,144 B2
(45) Date of Patent: Apr. 20, 2010

(54) VEHICULAR LAMP

(75) Inventors: Hironori Tsukamoto, Shizuoka (JP);
Noriaki Ito, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 214 days.

(21) Appl. No.: 11/858,701

(22) Filed: Sep. 20, 2007

(65) Prior Publication Data

US 2008/0129204 A1  Jun. 5, 2008

(30) Foreign Application Priority Data

Sep. 26, 2006  (JP) .............................. 2006-260557

(51) Int. Cl.
*B60Q 1/02* (2006.01)
(52) U.S. Cl. .............................. 315/82; 315/77; 315/32; 362/459; 362/85
(58) Field of Classification Search .................. 315/77, 315/82; 362/800, 459, 85, 362
See application file for complete search history.

(56) References Cited

U.S. PATENT DOCUMENTS 6,715,909 B2    4/2004  Serizawa
2005/0254251 A1*  11/2005  Chou ......................... 362/494

* cited by examiner

*Primary Examiner*—Douglas W Owens
*Assistant Examiner*—Jianzi Chen
(74) *Attorney, Agent, or Firm*—Osha • Liang LLP (57) ABSTRACT

A vehicular lamp includes a lamp body; a plurality of LED light sources disposed inside a lamp chamber formed by a front cover positioned in front of the lamp body; and a lighting circuit portion positioned behind the LED light sources. The LED light source is electrically connected to a conductive bus bar, and forms a light-emitting surface at a position opposite the front cover. The lighting circuit portion is formed on the back side of the light-emitting surface of the LED light source with respect to the front cover, and a circuit element thereof is electrically connected to the conductive bus bar. The conductive bus bar to which the LED light source is connected and the conductive bus bar to which the circuit element is connected are conductively connected.

20 Claims, 8 Drawing Sheets

BUS BAR BOARD OF CONTROL CIRCUIT PORTION

JOINT TERMINAL

LASER WELDING

RESISTANCE WELDING, SPOT WELDING, ETC.

Prior Art

Prior Art

FIG.15

VEHICULAR LAMP

BACKGROUND OF INVENTION

1. Field of the Invention

The present invention relates to a vehicular lamp using an LED as a light source.

2. Background Art

Figure 12:
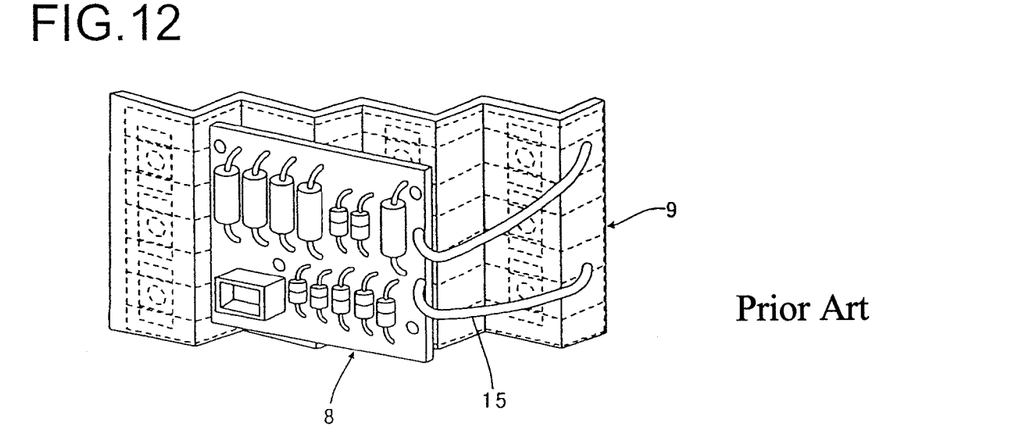
FIG. 12 is a schematic diagram showing a conventional structure of the control circuit portion and an LED light source assembly portion in the vehicular lamp.

In recent years, a variety of LEDs with excellent light emission efficiency and power consumption characteristics are being used as a light source in a vehicular lamp (see Patent Document 1 for an example). Such a vehicular lamp is provided with an LED light source assembly portion mounted with an LED and a unit that combines the LED light source assembly portion with a control circuit portion. As shown in FIG. 12, a conventional control circuit portion uses a printed circuit board 8, which is connected to the back side of the LED light source assembly portion by a jump cord 15.

[Patent Document 1] U.S. Pat. No. 6,715,909

SUMMARY OF INVENTION

In order to make a smaller overall unit, it is preferable that the control circuit portion and an LED light source assembly portion 9 are arranged adjacent to one another. However, a certain amount of space must be left due to the heat emitted by the printed circuit board 8, and the arrangement can only be made so compact using the conventional structure. For the purpose of suppressing heat, the conventional printed circuit board also needs dispersion resistors in order to disperse voltage or current. As a consequence, as more resistors are used, the size of the control circuit portion increases. If the problem of heat generation were resolved, then it would be possible to achieve both a smaller control circuit portion and an adjacent arrangement with the LED light source assembly portion.

One or more embodiments of the present invention provide a compact vehicular lamp that achieves downsizing of a control circuit portion, and downsizing of the overall unit through an adjacent arrangement with an LED light source assembly portion.

In one or more embodiments of the present invention, a vehicular lamp has a lamp body; a plurality of LED light sources that are inside a lamp chamber formed by a front cover positioned in front of the lamp body; and a lighting circuit portion that is positioned behind the LED light sources, wherein the LED light source is electrically connected to a conductive bus bar, and forms a light-emitting surface at a position opposite the front cover, the lighting circuit portion is formed on the back side of the light-emitting surface of the LED light source with respect to the front cover, and a circuit element thereof is electrically connected to the conductive bus bar, and the bus bar to which the LED light source is fixed and the bus bar to which the circuit element is fixed are conductively connected.

According to the above configuration, the LED light source and the lighting circuit portion are both structured using bus bars with high heat loss. Therefore, the LED light source and the lighting circuit portion can achieve an adjacent arrangement. In addition, by using the bus bars with high heat loss, dispersion resistors to compensate for heat generation can be eliminated or reduced in number. Therefore, the lighting circuit portion itself can be downsized. As a consequence, a unit structured by the LED light source and the lighting circuit portion can be downsized, thereby achieving a more compact lamp overall.

In one or more embodiments of the present invention, the bus bar to which the LED light source is fixed and the bus bar to which the circuit element is fixed are formed as a combined bus bar. According to such a configuration, the bus bars of the LED light source and the lighting circuit portion are combined, and following the assembly of electronic components, are subjected to bending. The unit can thus be downsized, thereby achieving a more compact lamp overall.

In one or more embodiments of the present invention, the bus bar to which the LED light source is fixed and the bus bar to which the circuit element is fixed are respectively held on separate boards, and the board holding the bus bar to which the circuit element is fixed is bendably formed on the back of the board holding the bus bar to which the LED light source is fixed. According to such a configuration, after the bus bars of the LED light source and the lighting circuit portion are separately formed, both are bendably joined. Likewise, the unit can thus be downsized, thereby achieving a more compact lamp overall.

In one or more embodiments of the present invention, the board is structured by the lamp body, and the bus bar is supported by both sides of the lamp body. According to such a configuration, it is possible to accurately fix a bus bar of the LED light source and a bus bar of the lighting circuit portion that have been formed and processed into complex shapes such as a stepped configuration. Accordingly, the unit can be efficiently accommodated regardless of whether the front cover has a curved shape, and thus achieve a more compact lamp overall.

According to one or more embodiments of the present invention, the LED light source and the lighting circuit portion are both structured using bus bars with high heat loss. Therefore, the LED light source and the lighting circuit portion can achieve an adjacent arrangement. In addition, by using the bus bars with high heat loss, dispersion resistors to compensate for heat generation can be eliminated. Therefore, the lighting circuit portion itself can be downsized. As a consequence, a unit structured by the LED light source and the lighting circuit portion can be downsized, thereby achieving a more compact lamp overall.

Other aspects and advantages of the invention will be apparent from the following description and the appended claims.

DETAILED DESCRIPTION

Figure 1:
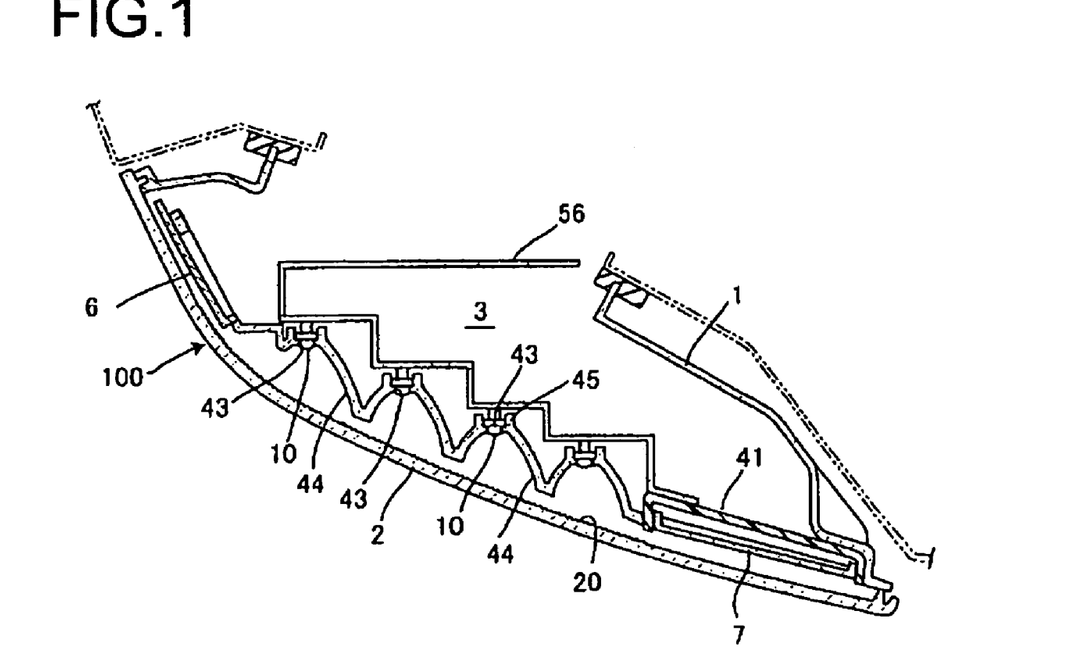
FIG. 1 is a horizontal cross-sectional view showing a structure of a vehicular lamp according to an embodiment of the present invention.

FIG. 1 is a horizontal cross-sectional view showing a structure of a vehicular lamp according to one or more embodiments of the present invention. Here, a tail and stop lamp, i.e., a marker lamp, will be used in the following description as an example of a vehicular lamp according to one or more embodiments of the present invention.

A tail and stop lamp 100 is mainly structured from a lamp body 1, a curved front cover 2, a lamp chamber 3 that is defined by the lamp body 1 and the front cover 2, a curved reflector 4 that is disposed inside the lamp chamber 3, and a bus bar unit 5 that is provided on the back side of the reflector 4. The bus bar unit 5 is a unit provided with an LED light source assembly portion 55 that is mounted with an LED 10, which acts as a light source of the tail and stop lamp 100, and a control circuit portion 56 that controls the light emission of the LED. In the example shown in the drawing, the bus bar unit 5 is fixed to the reflector 4 on a vehicle width-direction centerward side 41 and a vehicle left-side vicinity 42 of the reflector 4. Structuring the control circuit portion 56 from a bus bar circuit as well as the conventional LED light source assembly portion 55 is an important characteristic in the vehicular lamp according to one or more embodiments of the present invention.

Note that the reflector 4 is curved on a three-dimensional plane in the up-down and right-left directions, and is provided with a plurality of parabolic reflective surface portions 44. Back vertex portions of the parabolic reflective surface portions 44 are provided with an LED engagement portion 43. By engaging an LED body 11 with the LED engagement portion 43, the center of light emission from an LED 10 is self-positioned with respect to the parabolic reflective surface portion 44. Reference numeral 20 denotes a fish-eye lens that is provided in a region that corresponds to an entire formation region of at least the parabolic reflective surface portions 44 of the reflector 4 on the back side of the front cover 2.

The LED engagement portion 43 of the reflector 4 is also provided with an elastic hook 45 that grasps and holds the LED body 11. Through elastic deformation of the elastic hook 45, the LED body 11 (the bus bar unit 5) is easily attached to and removed from the LED engagement portion 43 from the back surface side of the reflector 4.

Reference numerals 6 and 7 denote reflex reflectors that are attached to the front surface sides of the right and left side edge portions of the reflector 4. Note that a region of the front cover 2 corresponding to the reflex reflectors 6 and 7 is a non-stepped region where the fish-eye lens 20 is not formed.

Following next is a description of a joining pattern for the LED light source assembly portion 55 and the control circuit portion 56, which structures the bus bar unit 5.

Figure 2:
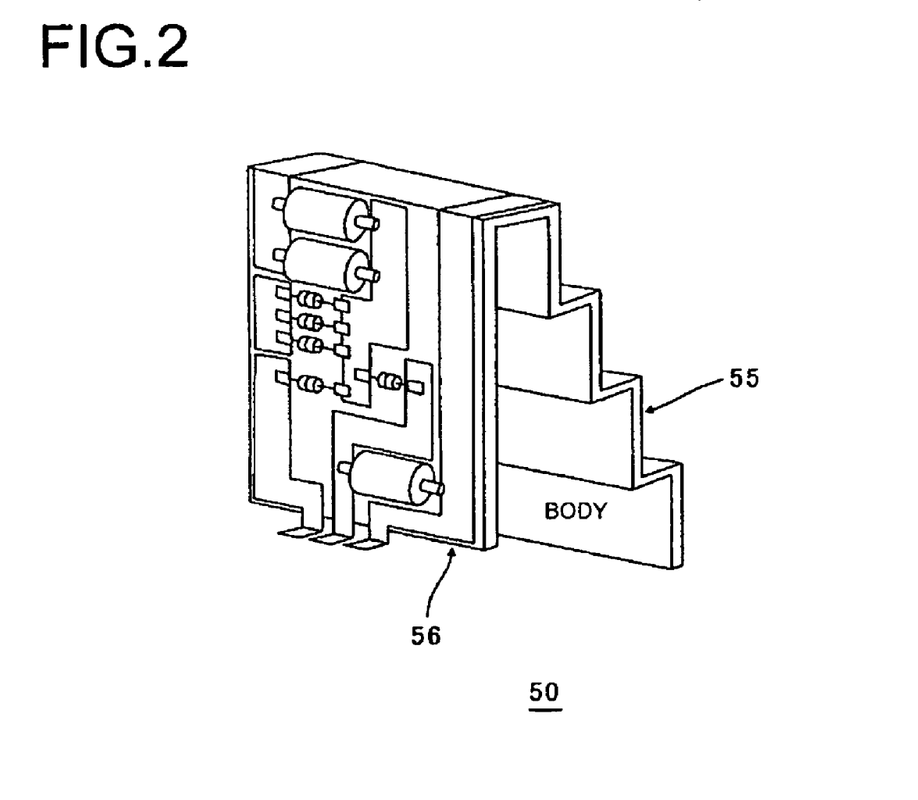
FIG. 2 is a perspective view showing a first structure example of a bus bar unit in the vehicular lamp according to an embodiment of the present invention.
Figure 3:
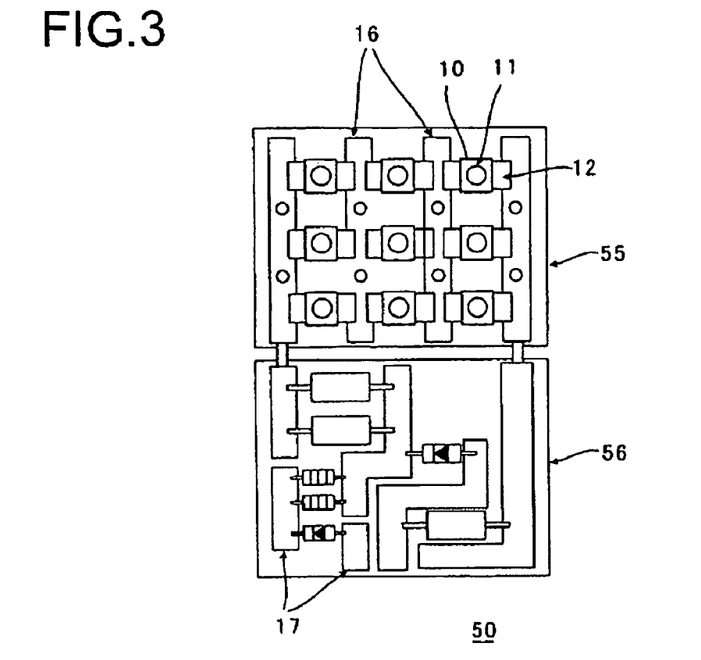
FIG. 3 is a schematic diagram showing a pre-molding board in the bus bar unit of the first structure example.

FIG. 2 is a perspective view showing a first structure example of a bus bar unit in the vehicular lamp according to an embodiment of the present invention. FIG. 3 is a schematic diagram showing a pre-molding board in the bus bar unit of the first structure example. As shown in FIGS. 2 and 3, a bus bar unit 50, i.e., the first structure example, is formed by assembling components such as an LED, a diode, a resistor, and the like to a bus bar circuit, which is an integration of the LED light source assembly portion 55 and the control circuit portion 56. Thereafter, a bus bar board that supports the bus bar circuit is subjected to bending (processing such as folding the LED light source assembly portion 55 into a stepped configuration).

As shown in FIG. 3, a region on one side of the bus bar unit 50 is formed with the LED light source assembly portion 55, that is, an LED module wherein the LED 10 emitting red light in a grid configuration is disposed on the bus bar circuit. In other words, one of a pair of contact terminals 12 leading out from the LED body 11 on two adjacent bus bars 16 is respectively joined according to a joining method to be described later in order to structure a power supply route for the LED 10. The LED 10 has a structure in which a pair of tab-shaped metal contact terminals lead out in an L-shape configuration from the back side of the LED body 11, which is an oblong-shaped body formed from synthetic resin. As described above, the end sides of the contact terminals 12 are respectively engaged with the bus bars 16 of the bus bar unit 50 and together form the LED light source assembly portion 55.

In addition, a region on the opposite side of the bus bar unit 50 is formed with the control circuit portion 56, which is connected to the LED light source assembly portion 55 and controls the lighting of the LED 10.

In a conventional vehicular lamp, even if the LED light source assembly portion is structured using bus bars, the control circuit portion was still formed using a printed circuit board, and therefore it was impossible to achieve the bus bar unit 50 by forming the two in a combined manner. However, in the vehicular lamp according to one or more embodiments of the present invention, the circuitry of the control circuit portion also uses bus bars 17, making it possible to achieve a combined formation.

Figure 4:
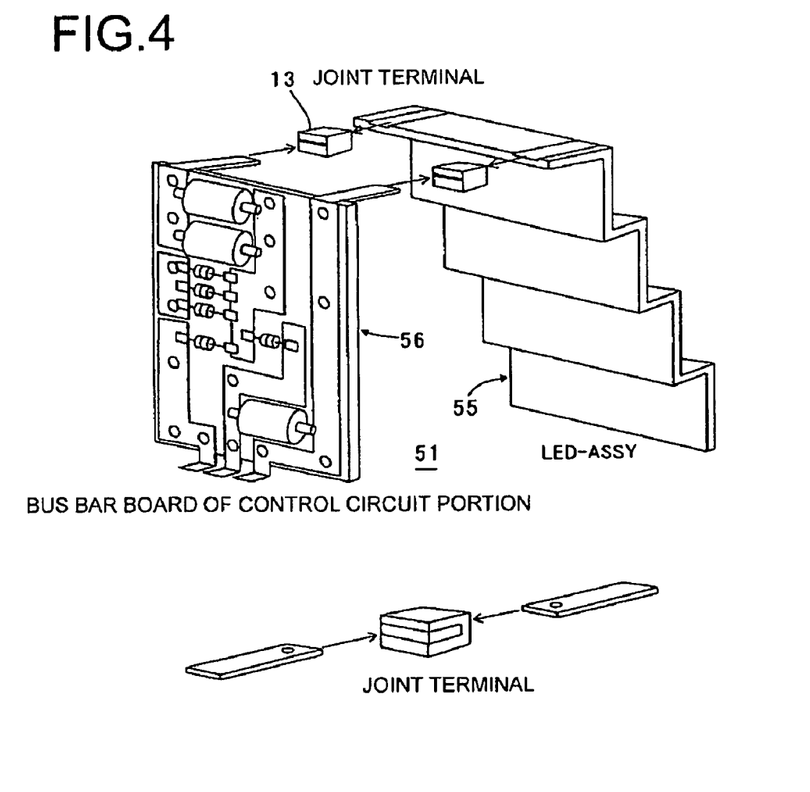
FIG. 4 is a perspective view showing a second structure example of a bus bar unit in the vehicular lamp according to an embodiment of the present invention.

Next, FIG. 4 is a perspective view showing a second structure example of a bus bar unit in the vehicular lamp according to the embodiment of the present invention. As shown in FIG. 4, a bus bar unit 51, i.e., the second structure example, is structured by using a joint terminal 13 to join a bus bar board of the LED light source assembly portion 55 and a bus bar board of the control circuit portion 56, which were formed in a separate process.

Figure 5:
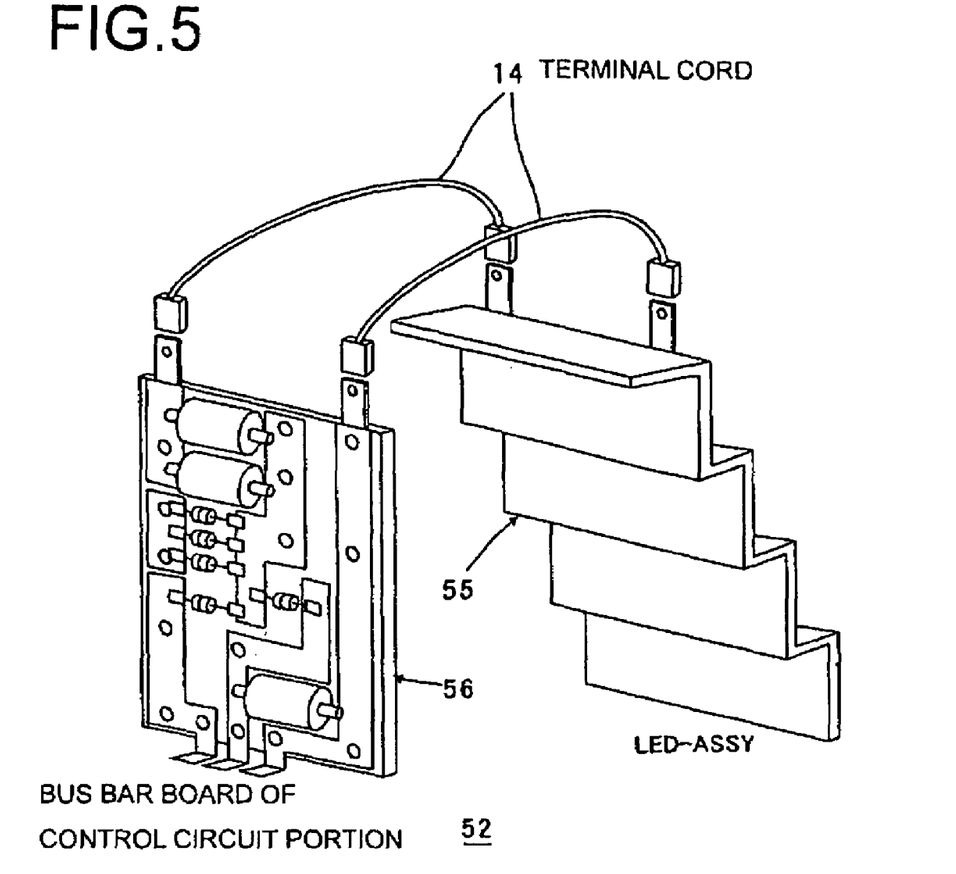
FIG. 5 is a perspective view showing a third structure example of a bus bar unit in the vehicular lamp according to an embodiment of the present invention.

FIG. 5 is a perspective view showing a third structure example of a bus bar unit in the vehicular lamp according to the embodiment of the present invention. As shown in FIG. 5, a bus bar unit 52, i.e., the third structure example, is structured by using a terminal cord 14 to join a bus bar board of the LED light source assembly portion 55 and a bus bar board of the control circuit portion 56, which were formed in a separate process.

Although the bus bar units 51 and 52 have more components than in the case of a combined unit, they also have the advantage of enabling standardization of the bus bar board of the control circuit portion 56. The bus bar unit 52 has the further advantage of not necessarily being limited to an adjacent arrangement when the layout of the lamp chamber is restricted, and instead allows placement in other suitable arrangements.

Figure 6:
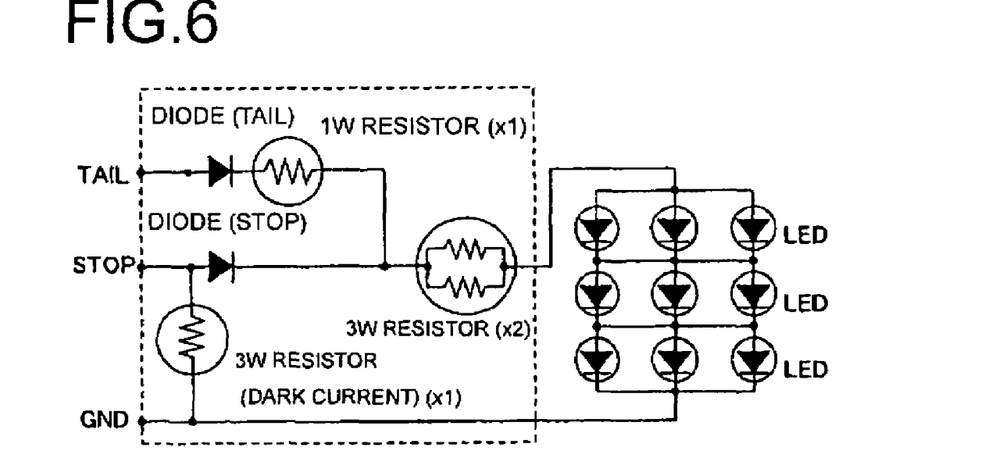
FIG. 6 is circuit diagram showing an example of a control circuit portion structured by the bus bar in the vehicular lamp according to an embodiment of the present invention.
Figure 13:
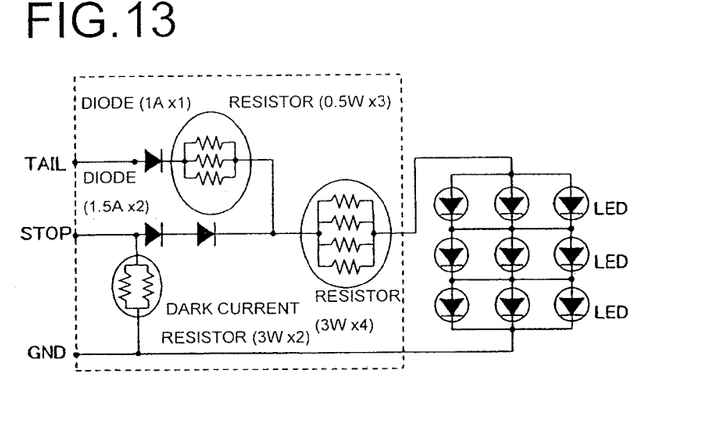
FIG. 13 is a circuit diagram in a case where the same functions of the control circuit portion structured by the bus bar are achieved with a printed circuit board.

Next, the circuitry of the control circuit portion 56 will be described. FIG. 6 is circuit diagram showing an example of a control circuit portion structured by the bus bar in the vehicular lamp according to an embodiment of the present invention. The number of resistors can be reduced as compared to the circuit diagram (see FIG. 13) where the same functions are realized with a printed circuit board. Therefore, downsizing of the bus bar board itself in the control circuit portion 56 can be achieved.

Figure 7:
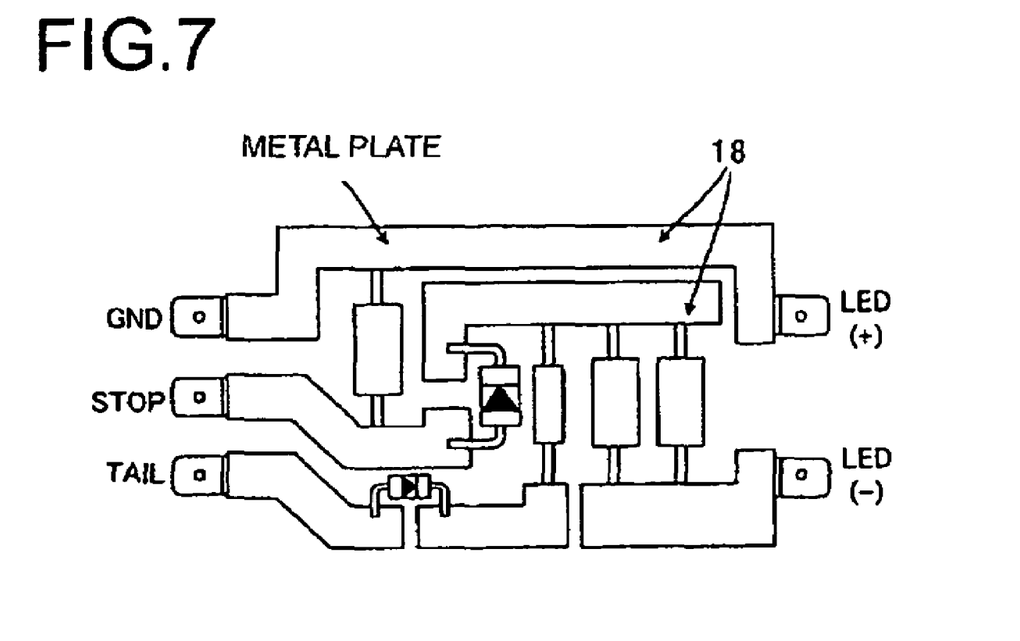
FIG. 7 is a schematic diagram showing an example of a bus bar circuit of the control circuit portion in the vehicular lamp according to an embodiment of the present invention.
Figure 14:
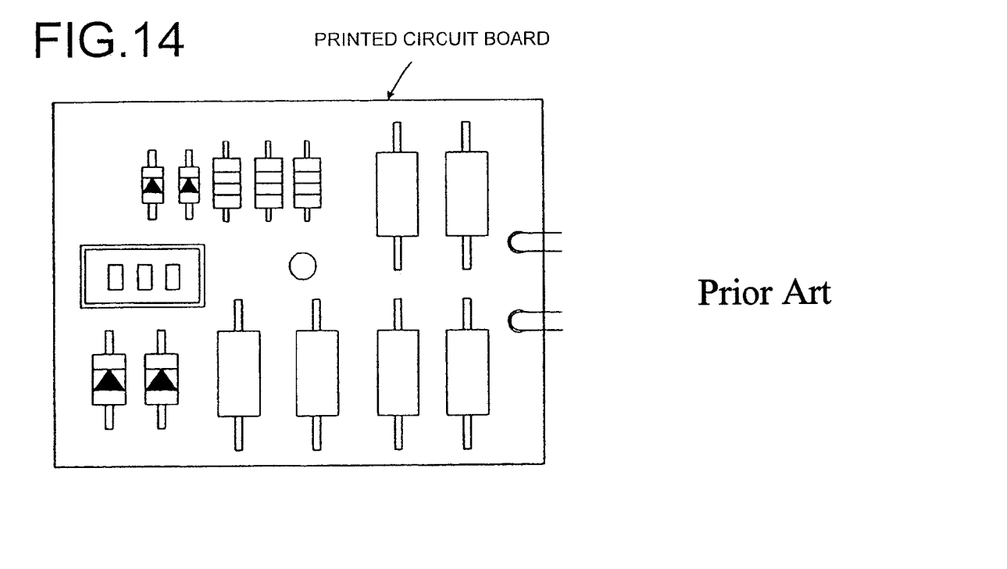
FIG. 14 is a schematic diagram showing a conventional control circuit portion structured by the printed circuit board.

The following is a description of modes for joining electronic components in the control circuit portion 56. FIG. 7 is a schematic diagram showing an example of a bus bar circuit of the control circuit portion in the vehicular lamp according to an embodiment of the present invention. A conventional control circuit portion (see FIG. 14) structured using a printed circuit board required joining by soldering. However, in the vehicular lamp according to an embodiment of the present invention, structuring the control circuit portion using the bus bar 18 enables joining by caulking, welding, pressure welding, or the like, thus eliminating the need for soldering.

Figure 8:
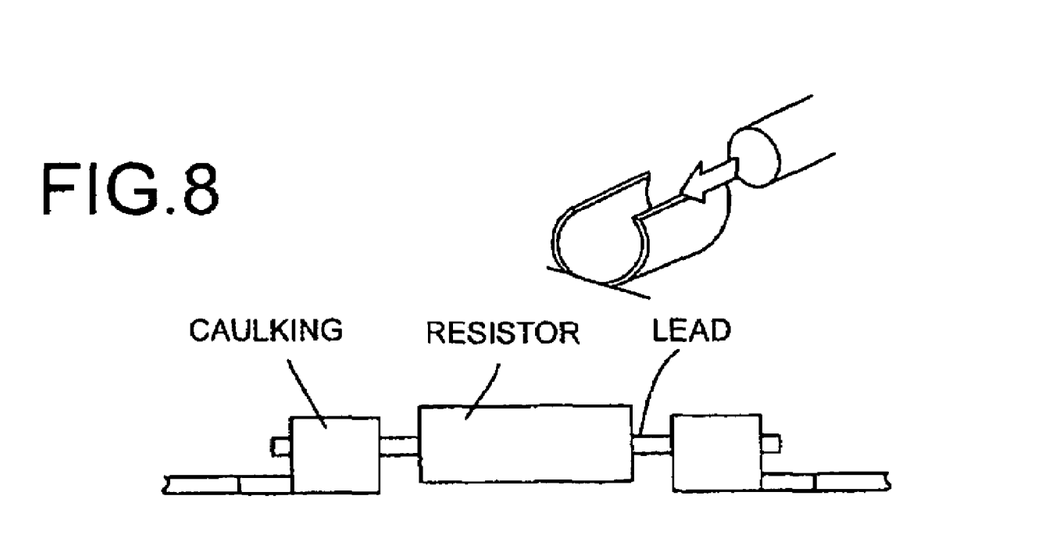
FIG. 8 is a schematic diagram roughly showing the joining of components (caulking) in the bus bar circuit.
Figure 9:
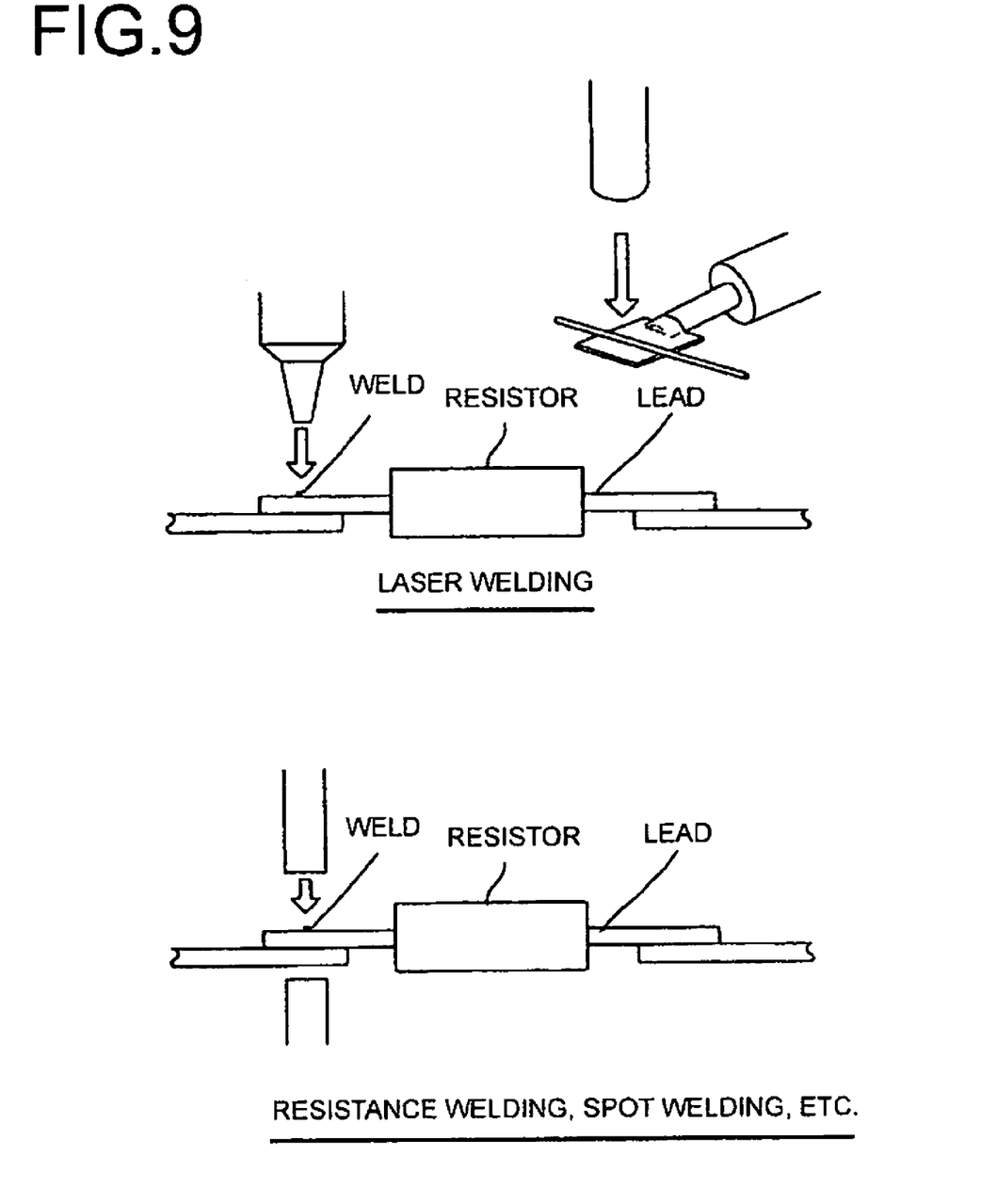
FIG. 9 is a schematic diagram roughly showing the joining of components (welding) in the bus bar circuit.
Figure 10:
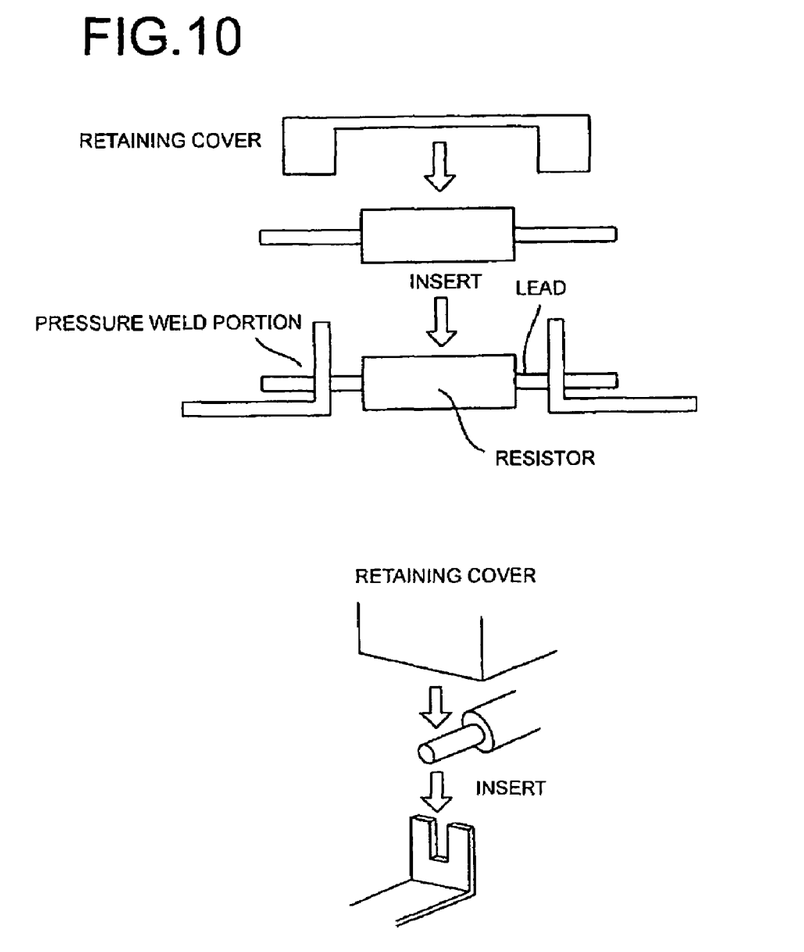
FIG. 10 is a schematic diagram roughly showing the joining of components (pressure welding) in the bus bar circuit.
Figure 15:
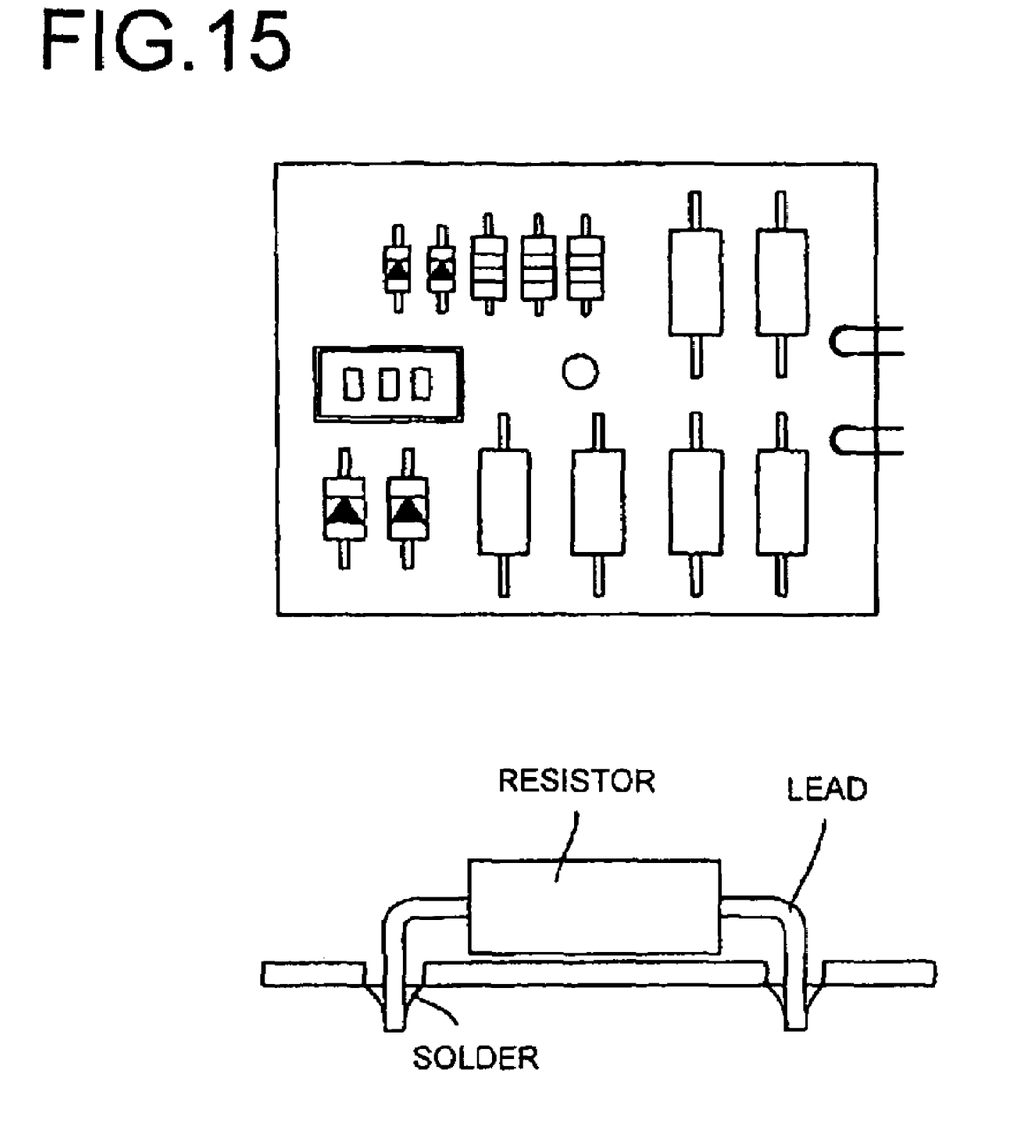
FIG. 15 is a schematic diagram roughly showing soldering on the printed circuit board.

FIGS. 8 to 10 are schematic diagrams showing the joining of components in the bus bar circuit. In the control circuit portion of the vehicular lamp according to an embodiment of the present invention, components are joined in the bus bar circuits by methods such as caulking (FIG. 8), welding (FIG. 9), and pressure welding (FIG. 10), thus eliminating the need for joining by soldering. Regarding the soldered portion (see FIG. 15) of the printed circuit board, the soldering melts at high temperatures. Therefore, dispersion resistors must be used to keep the heat generated at the soldering portion under a specific tolerance, similar to the problem of heat generation in the printed circuit board. As a consequence, the number of resistors increases. However, if the components are joined by a method such as shown in FIGS. 8 to 10 using a bus bar, then the problem of heat generation related to the soldering is resolved, and the number of resistors can be reduced. Thus, the unit including the control circuit portion and the LED light source assembly portion, and by extension, the overall lamp, can be downsized.

Figure 11A:
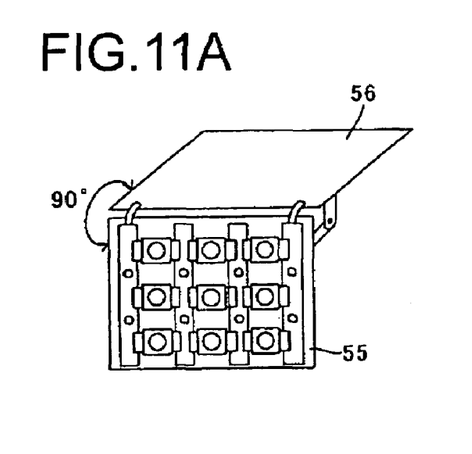
FIG. 11 is a schematic diagram showing another embodiment of the bus bar unit in the vehicular lamp according to an embodiment of the present invention.
Figure 11B:
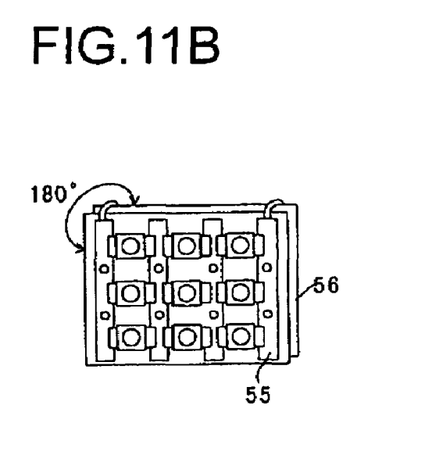

FIG. 11 is a schematic diagram showing the bus bar unit in the vehicular lamp according to an embodiment of the present invention. If the front cover of the tail and stop lamp is flat without curvature and there is no need to process the LED light source assembly portion 55 in a stepped configuration as shown in FIG. 1, then the bus bar unit 50 with a combined formation can be folded at a 90-degree angle (FIG. 11(a)) or at a 180-degree angle (FIG. 11(b)) so that the bus bar circuit portion takes up less space.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF THE REFERENCE NUMERALS

1 LAMP BODY
2 FRONT COVER
3 LAMP CHAMBER
4 REFLECTOR
5 BUS BAR UNIT
6, 7 REFLEX REFLECTOR
8 PRINTED CIRCUIT BOARD
9 LED LIGHT SOURCE ASSEMBLY PORTION
10 LED
11 LED BODY
12 CONTACT TERMINAL
13 JOINT TERMINAL
14 TERMINAL CORD
15 JUMP CORD
16, 17, 18 BUS BAR
20 FISH-EYE LENS
43 LED ENGAGEMENT PORTION
44 PARABOLIC REFLECTIVE SURFACE PORTION
45 ELASTIC HOOK
50, 51, 52 BUS BAR UNIT
55 LED LIGHT SOURCE ASSEMBLY PORTION
56 CONTROL CIRCUIT PORTION
100 TAIL AND STOP LAMP

What is claimed is:

1. A vehicular lamp comprising:
a lamp body;
a front cover; and
a bus bar unit comprising:
an LED light source assembly portion comprising:
a first conductive bus bar, and
an LED light source electrically connected to the first conductive bus bar, and
a control circuit portion, for controlling the LED light source assembly portion, comprising:
a second conductive bus bar, and
a circuit element electrically connected to the second conductive bus bar,
wherein the first conductive bus bar is conductively connected to the second conductive bus bar,
wherein the control circuit portion is positioned behind the LED light source assembly portion,
wherein the LED light source is disposed inside a lamp chamber formed by the front cover positioned in front of the lamp body,
wherein the LED light source forms a light-emitting surface at a position opposite the front cover,
wherein the control circuit portion is formed on a back side of the light-emitting surface of the LED light source with respect to the front cover.

2. The vehicular lamp according to claim 1, wherein the first conductive bus bar to which the LED light source assembly portion is connected and the second conductive bus bar to which the circuit element is connected are formed as a combined bus bar.

3. The vehicular lamp according to claim 2, wherein the combined bus bar is supported by both sides of the lamp body.

4. The vehicular lamp according to claim 3, wherein the combined bus bar is formed at one of a 90-degree angle or a 180-degree angle.

5. The vehicular lamp according to claim 1, wherein
the first conductive bus bar to which the LED light source assembly portion is connected and the second conductive bus bar to which the circuit element is connected are respectively disposed on separate circuit boards, and
the circuit board holding the second conductive bus bar to which the circuit element is connected is bendably formed on a back side of the circuit board holding the first conductive bus bar to which the LED light source assembly portion is connected.

6. The vehicular lamp according to claim 1, wherein the first conductive bus bar to which the LED light source assembly portion is connected is supported by both sides of the lamp body.

7. The vehicular lamp according to claim 1, wherein the second conductive bus bar to which the circuit element is connected is supported by both sides of the lamp body.

8. The vehicular lamp according to claim 1,
wherein a plurality of LED light sources are disposed inside the lamp chamber,
wherein the plurality of LED light sources are electrically connected to the first conductive bus bar, and
wherein the control circuit portion is positioned behind the LED light sources.

9. The vehicular lamp according to claim 1, wherein the circuit element of the lighting circuit portion is electrically connected to the second conductive bus bar by one of caulking, welding, and pressure welding.

10. The vehicular lamp according to claim 1, wherein control circuit portion is formed in a stepped configuration.

11. A vehicular lamp comprising:
a lamp body;
a front cover; and
a bus bar unit comprising:
an LED light source assembly comprising:
a first conductive bus bar, and
an LED light source electrically connected to the first conductive bus bar, and
a control circuit, for controlling the LED light source assembly, comprising:
a second conductive bus bar, and
a circuit element electrically connected to the second conductive bus bar,
wherein the first conductive bus bar is conductively connected to the second conductive bus bar,
wherein the LED light source assembly is disposed inside a lamp chamber formed by the front cover positioned in front of the lamp body.

12. The vehicular lamp according to claim 11, wherein the first conductive bus bar to which the LED light source assembly is connected and the second conductive bus bar to which the circuit element of the control circuit is connected are formed as a combined bus bar.

13. The vehicular lamp according to claim 12, wherein the combined bus bar is supported by both sides of the lamp body.

14. The vehicular lamp according to claim 12, wherein the combined bus bar is formed at one of a 90-degree angle or a 180-degree angle.

15. The vehicular lamp according to claim 11, wherein
the first conductive bus bar to which the LED light source assembly is connected and the second conductive bus bar to which the circuit element of the control circuit is connected are respectively disposed on separate circuit boards, and
the circuit board holding the second conductive bus bar to which the circuit element of the control circuit is connected is bendably formed on a back side of the circuit board holding the first conductive bus bar to which the LED light source assembly is connected.

16. The vehicular lamp according to claim 11, wherein the first conductive bus bar to which the LED light source assembly is connected is supported by both sides of the lamp body.

17. The vehicular lamp according to claim 11, wherein the second conductive bus bar to which the circuit element is connected is supported by both sides of the lamp body.

18. The vehicular lamp according to claim 11,
wherein the LED light source assembly comprises a plurality of LED light sources electrically connected to the first conductive bus bar, and
wherein the control circuit portion is positioned behind the LED light sources.

19. The vehicular lamp according to claim 11, wherein the circuit element of the control circuit is electrically connected to the second conductive bus bar by one of caulking, welding, and pressure welding.

20. The vehicular lamp according to claim 11, wherein the control circuit is formed in a stepped configuration.

* * * * *